United States Patent [19]

Peterson et al.

[11] Patent Number: 5,166,660
[45] Date of Patent: Nov. 24, 1992

[54] RANDOM ACCESS COMPARE ARRAY

[75] Inventors: LuVerne R. Peterson, San Diego; Cevat Kumbasar, Irvine, both of Calif.

[73] Assignee: UNISYS Corporation, Blue Bell, Pa.

[21] Appl. No.: 762,661

[22] Filed: Sep. 19, 1991

[51] Int. Cl.$^5$ .............................................. G06F 7/04
[52] U.S. Cl. .................................................. 340/146.2
[58] Field of Search ..................................... 340/146.2

[56] References Cited

U.S. PATENT DOCUMENTS

| | | | |
|---|---|---|---|
| 4,857,882 | 8/1989 | Wagner et al. | 340/146.2 |
| 4,896,133 | 1/1990 | Methrin et al. | 340/146.2 |
| 5,003,286 | 3/1991 | Carbonaro et al. | 340/146.2 |
| 5,060,143 | 10/1991 | Lee | 340/146.2 |

Primary Examiner—David H. Malzahn
Attorney, Agent, or Firm—Charles J. Fassbender; Mark T. Starr

[57] ABSTRACT

A random access compare array, on an integrated circuit chip is comprised of a plurality of multi-bit comparator circuits. Each comparator circuit is coupled to a respective multi-bit register; and, each comparator circuit is also coupled to an address distribution circuit which receives a compare address and sends the compare address to all of the comparator circuits. A respective match signal is generated by each comparator circuit which indicates when the compare address and the content of the register that is coupled to the comparator are equal. Also, operating in parallel with the generation of the match signals is a match selection circuit which receives a select address and in response passes one match signal to a single output pin. Due to the parallel operation of the compare-select circuits, the speed of operation is greatly increased; and due to the selective passing of any of the match signals to a single output pin, the size of the array is not pin limited.

11 Claims, 6 Drawing Sheets

RANDOM ACCESS COMPARE ARRAY

BACKGROUND OF THE INVENTION

This invention relates to architectures for a data cache, and to the circuit design of data cache components which enable the cache to operate at high speed.

By a data cache is herein meant an electronic circuit which stores multiple words of digital data and which also stores a respective compare address for each data word that is used in accessing a particular word of data. Each data word can be any type of digital information, such as a computer operand or a computer instruction for example.

One data cache architecture of the prior art consists essentially of a CAM (content addressable memory) in combination with a DATA RAM (random access memory). In operation, a compare address is sent to the CAM where it is compared with a plurality of N registers. Each such compare produces a respective match output signal $MATCH_i$ ($i=1, 2, \ldots N$); and those $MATCH_i$ signals are then sent from the CAM to the DATA RAM where they select respective data words.

A drawback, however, of the above cache architecture is that the speed of the cache is limited by the speed of the CAM plus the speed of the RAM. This is because the CAM compare operation must be completed before the RAM read operation can begin. Further, an additional drawback is that as the number of registers in the CAM is increased, then a point is quickly reached where the CAM cannot be implemented on an integrated circuit chip. This is because each register produces a $MATCH_i$ signal which goes off the chip, and the total number of input/output pins on even the most advanced chips are limited to less than three-hundred.

A second data cache architecture, which is an improvement over the above cache, is comprised of an ADDRESS RAM and a comparator in combination with the DATA RAM. In operation, the compare address is partitioned into a high order portion $A_H$ and a low order portion $A_L$; and, address portion $A_L$ is used to read an address from the ADDRESS RAM and a data word the DATA RAM is parallel. Then, the address that is read from the ADDRESS RAM is compared to $A_H$. If a match occurs, the data from the DATA RAM is valid; otherwise the data is invalid.

With this second architecture, the above described I/O pin limitation problem is overcome since only one comparison is made and so the multiple $MATCH_i$ signals are eliminated. However, with this second architecture, the speed of the cache becomes limited by the speed of the ADDRESS RAM plus the speed of the comparator. That is because the compare operation cannot occur until after the ADDRESS RAM is read.

Accordingly, a primary object of the invention is to provide a novel circuit, hereinafter called a random access compare array, which greatly increases the operating speed of a cache and which is not pin limited when implemented on an integrated circuit chip.

BRIEF SUMMARY OF THE INVENTION

In accordance with the present invention, a random access compare array includes a plurality of multi-bit comparator circuits on an integrated circuit chip. Each of the comparator circuits has first and second input ports, has a respective multi-bit register coupled to the first port, and generates a respective match signal when the second port receives a compare address that equals the bits of the register on the first port. Also, a compare address distribution circuit is included on the chip which receives the compare address and sends the compare address to the second port on all of the comparator circuits. Further, a match selection circuit is included on the chip which receives a select address and in response selects a group of several of the comparator circuits. This selection occurs in parallel with the generation of the match signals; and due to this parallel operation, the speed of the array is substantially increased. Also in response to the select address, the match selection circuit passes a single match signal from the group of selected comparator circuits to a single output terminal of the chip; and thus the number of match signals that are generated on the chip is not limited by the chip's input/output pins.

To further increase the speed of the random access compare array, the match selection circuit selects all of the compare circuits of a group by generating a separate selection signal for that group; and, each multi-bit compare circuit in the group loads that selection signal with an input capacitance that is substantially less than the gate capacitance of a single transistor times the total number of bits in the compare circuit. To still further increase speed, the match selection circuit includes a respective sense amplifier coupled to each match signal in a group, a respective selector coupled to each sense amplifier, an output sense amplifier coupled to all of the selectors, and no intervening multiplexor anywhere between the selected group and the output sense amplifier. To even further increase speed, each compare circuit shifts the voltages on a pair of conductors towards each other by half of a normal logic level when the first and second ports receive unequal bits, and it shifts the voltages on the conductors away from each other by half of a normal logic level when the first and second ports receive equal bits.

By using the above random access compare array in combination with a RAM, a data cache can be constructed which operates more then 2½ times faster than the prior art.

BRIEF DESCRIPTION OF THE DRAWINGS

Various features and advantages of the invention are described herein in conjunction with the accompanying drawings, wherein.

DETAILED DESCRIPTION

Figure 1:
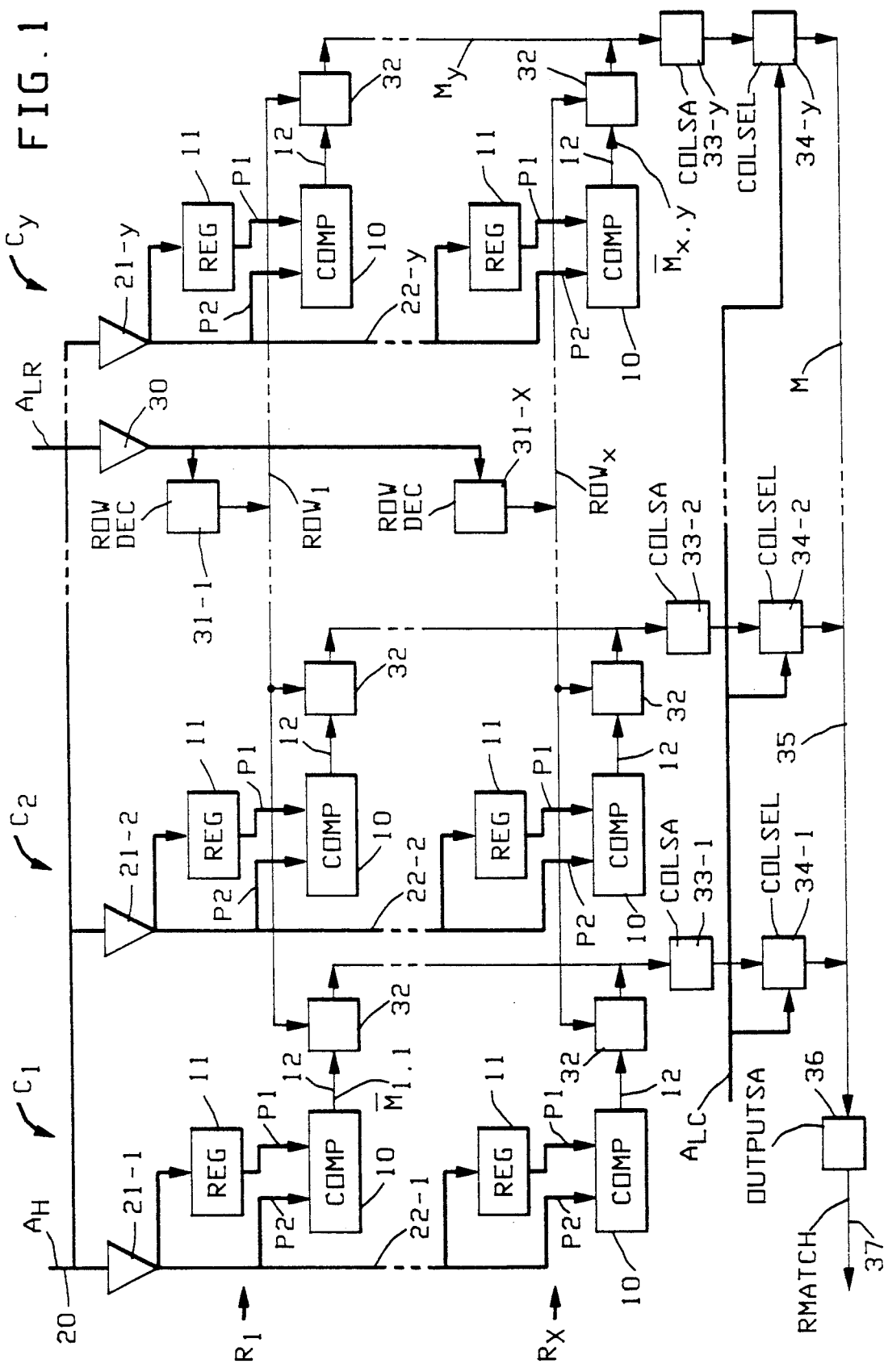
FIG. 1 shows an overview of a random access compare array that is configured according to the present invention.

Referring now to FIG. 1, it shows an overview of a preferred embodiment of a random access compare array which is constructed according to the present invention. Included in this random access compare array are a plurality of multi-bit comparators 10 which are arranged on a semiconductor chip in rows and columns. In FIG. 1, each comparator 10 is labeled "comp"; the first row of comparators 10 is labeled "$R_1$"; the last row is labeled "$R_x$"; the first column is labeled "$C_1$; the second column is labeled "$C_2$"; and the last column is labeled "$C_y$". For most practical arrays, the number of rows "x" ranges from thirty-two to four-thousand-ninety-six, and the number of columns "y" ranges from four to sixty-four. Preferably, the rows and columns are selected such that the resulting array is nearly square.

Each comparator 10 has a multi-bit input port P1 and a multi-bit input port P2. Each comparator also has a respective multi-bit register 11 (labeled "REG") coupled to its' input port P1. In operation, each comparator 10 generates a match signal on a respective conductor 12 which indicates when the second port P2 receives a compare address $A_H$ that equals the content of register 11 on port P1. This match signal from the comparator 10 at row $R_1$ and column $C_1$ is labeled $\overline{M}_{1,1}$; and from the comparator at row $R_x$ and column $C_y$, the match signal is labeled $\overline{M}_{x,y}$.

Also in the FIG. 1 random access compare array is a compare address distribution circuit which includes components 20, 21-1 thru 21-Y, and 22-1 thru 22-Y. Component 20 is a multi-bit bus that receives the compare address $A_H$. Components 21-1 thru 21-Y are buffer circuits which repower the compare address $A_H$, and one such buffer circuit is disposed in each column. Components 22-1 thru 22-Y are multi-bit busses that are respectively disposed in the columns and which carry the compare address $A_H$ from the buffer circuits to input port P2 of all of the comparators 10.

Further in the FIG. 1 random access compare array is a match selection circuit which includes components 30, 31-1 thru 31-X, 32, 33-1 thru 33-Y, 34-1 thru 34-Y, 35, 36, and 37. Component 30 is a buffer circuit. Components 31-1 thru 31-X are respective row decoder circuits which are respectively disposed in each of the rows. Component 32 is a selector circuit, and one selector circuit is associated with each comparator 10. Components 33-1 thru 33-Y are respective column sense amplifiers (labeled COLSA), and one sense amplifier is provided in each column. Components 34-1 thru 34-Y are respective column select circuits (labeled COLSEL), and one such circuit is associated with each column sense amplifier. Component 35 is an output bus from all of the column selectors. Component 36 is an output sense amplifier for output bus 35; and component 37 is a single output conductor from the sense amplifier 36.

In operation, a row select address $A_{LR}$ is sent to component 30, and a column select address $A_{LC}$ is sent to components 34-1 thru 34-Y. In response to the row select address $A_{LR}$, components 30, 31-1 thru 31-X, and 32 select one row of comparator circuits 10. This row selection occurs in parallel with the generation of the match signals on the conductors 12. Also, in response to the column select address $A_{LC}$, components 33-1 thru 33-Y, 34-1 thru 34-Y, 35, 36 and 37 pass one match signal from the selected row to the output conductor 37. This randomly selected match signal in FIG. 1 is labeled "RMATCH".

Figure 2:
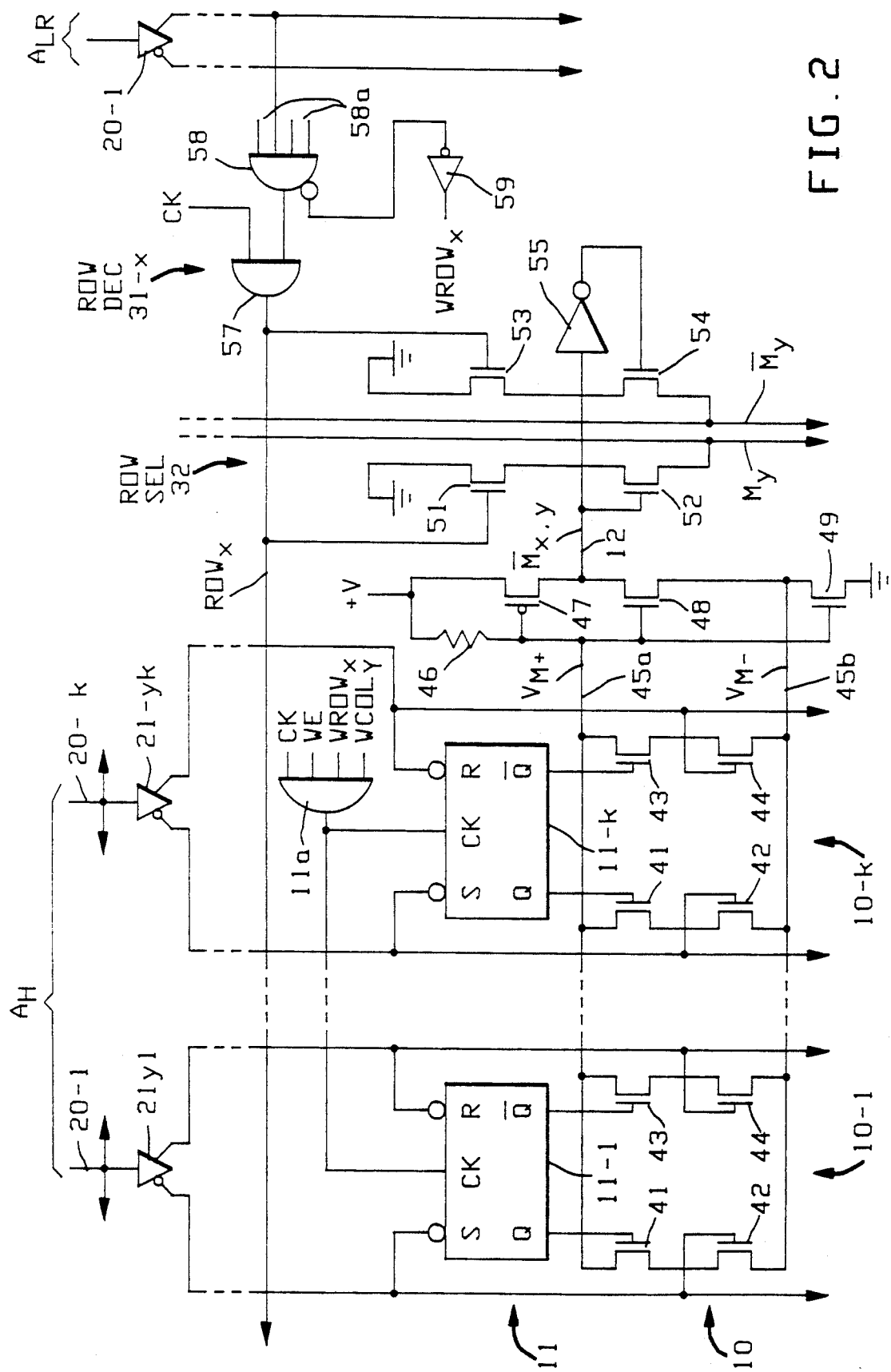
FIG. 2 shows a detailed circuit diagram of some of the components in the FIG. 1 array.

Turning now to FIG's. 2 and 3, additional details of the circuits which make up the above described FIG. 1 array will be described. As FIG. 2 shows, the multi-bit bus 20 includes "k" conductors 20-1 through 20-k, where "k" is the number of bits in the compare address $A_H$. Each of the conductors 20-1 through 20-k carries a respective bit of that compare address. For most practical cases, "k" will range from ten to sixty; however, "k" can be any positive integer.

Also as FIG. 2 shows, the buffer circuit 21-Y includes "k" logic gates 21-Y1 through 21-Yk, each of which has an inverting and non-inverting output. Each gate receives a respective bit of the compare address $A_H$, and the outputs from each gate are sent to all of the registers 11 and all of the comparators 10 in column $C_Y$. For simplicity, only one comparator and one register is shown. In all of the other columns C1, C2, etc. the buffer circuits 21-1, 21-2, etc. are constructed in a similar fashion.

Further as FIG. 2 shows match circuit 10 has "k" stages 10-1 thru 10-k. All of the components in match circuit 10 are identified with reference numerals 41 thru 49 and 12. Components 41, 42, 43, 44, 48 and 49 are N-channel field effect transistors; component 47 is a P-channel field effect transistor; component 46 is a resistor; and components 45a, 45b and 12 are conductors. Components 41–44 are repeated for each of the "k" stages. All of these match circuit components are interconnected at row $R_x$ of column $C_Y$ as shown; and at all of the other row-column locations, the match circuits 10 have the same structure.

Likewise, as FIG. 2 shows, each register 11 includes "k" set-reset latches 11-1 thru 11-k. In operation, match circuit 10 compares the "k" bits in register 11 to the "k" bits on bus 20. If a match occurs, the match signal $\overline{M}_{x,y}$ on conductor 12 is generated as a low logic level (ground). If a mis-match occurs, signal $\overline{M}_{x,y}$ is generated as a high (+V) logic level. Generation of signal $\overline{M}_{x,y}$ occurs as follows.

In the case where a match occurs, no conductive path exists from conductor 45a to conductor 45b through the transistors 41–44. That is, when transistor 41 is ON and transistor 43 is off in one particular stage, then transistor 42 is off and transistor 44 is ON; and vice versa. Consequently, when a match occurs, conductors 45a and 45b are separated by an open circuit. Due to this open circuit, the voltage $V_{M+}$ on conductor 45a rises to +V since that conductor is coupled to the +V supply through resistor 46. Conductor 45a is also coupled to the gate of the P-channel transistor 47, and the +V voltage turns that transistor off. Conductor 45a is further coupled to the gate of the N-channel transistors 48 and 49, and the +V voltage on conductor 45a turns those transistors ON. Due to the "ON" state of the transistors 48 and 49, signal $V_{M-}$ on conductor 45b and the match signal $\overline{M}_{x,y}$ on conductor 12 are shorted to ground.

During a mismatch, a conductive path does exist from conductor 45a to conductor 45b through one or more stages 10-1 thru 10-k of the match circuit 10. Due to that conductive path, signal $V_{M+}$ on conductor 45a drops and signal $V_{M-}$ on conductor 45b rises. This reduces the gate-to-source voltage of transistor 48 to the point where transistor 48 turns OFF. At the same time, the reduced voltage $V_{M+}$ on conductor 45a causes transistor 47 to turn ON. Thus with transistor 47 ON and transistor 48 OFF, the match signal $M_{x,y}$ on conductor 12 rises to +V.

Preferably, the transistors 41–44 are selected such that when all of stages 10-1 thru 10-k conduct, the total resistance through those stages is near zero; and, preferably transistor 49 is selected such that its resistance in its ON state approximates that of resistor 46. With such a circuit design, the voltages $V_{M+}$ and $V_{M-}$ both equal −V/2 when all of the bits in register 11 miscompare with all of the bits on bus 20. This means that the voltage swing that occurs on the conductors 45a and 45b when match changes to a total mismatch (and vice versa) is only one-half of supply voltage +V. Consequently, the match/mismatch can be detected in less time then it would otherwise take to generate a full voltage swing of +V.

In the event that a miscompare occurs in only one of the stages 10-1 thru 10-N, the resistance from conductor 45a to conductor 45b will rise from the near zero resistance that it has when all of the stages miscompare. However, such an increased resistance will not adversely affect the operation of the comparator 10 so long as the voltage drop across that resistance remains small enough to keep transistor 48 turned off.

Further as shown in FIG. 2, row selector 32 includes four N-channel transistors 51-54 and one inverter 55; and row decoder 31-x includes an AND gate 57, a NAND/AND gate 58, and an Inverter 59. All of these components are interconnected as shown. In operation, gate 58 receives all of the $A_{LR}$ address bits that are needed to decode row $R_x$. For simplicity, only one such bit is shown in FIG. 2, and the remaining bits are implied by the multiple input leads 58a. Each bit to gate 58 comes from a respective logic gate in the $A_{LR}$ address buffer circuit 20, similar to the illustrated gate 20-1. Gate 58 has its non-inverting output AND'd with a clock signal CK by AND gate 57, and that produces signal $ROW_x$ which selects all of the match circuits 10 in row $R_x$ during a compare-read operation. Gate 58 also has its inverting output coupled to Inverter 59, and that produces signal $WROW_x$ which selects a register 11 during a write operation.

Selection of the match circuits occurs by sending signal $ROW_x$ to the gate of transistors 51 and 53 in all of the row selection circuits 32 of row $R_x$. In response to signal $ROW_x$ being high, transistors 51 and 53 turn ON. If signal $\overline{M}_{x,y}$ on conductor 12 is high (indicating a mismatch), transistor 52 will turn ON, and the $M_Y$ output of row selector 32 will be coupled to ground through transistors 51 and 52. Conversely, if signal $\overline{M}_{x,y}$ on conductor 12 is low (indicating a match), transistor 54 will turn ON, and the $\overline{M}_Y$ output of row selector 32 will be coupled to ground through transistors 53 and 54.

With the above described row selection circuitry, signal $ROW_x$ from row decoder 31-x is loaded down capacitively by only two transistors 51 and 53 for each match circuit in row $R_x$. Such capacitive loading is approximately "k" times lower than that which would occur if signal $ROW_x$ had to drive two transistors for each stage of each match circuit in row $R_x$. Consequently, signal $ROW_x$ can switch much faster than it otherwise could if each stage of each match circuit were a capacitive load.

Figure 3:
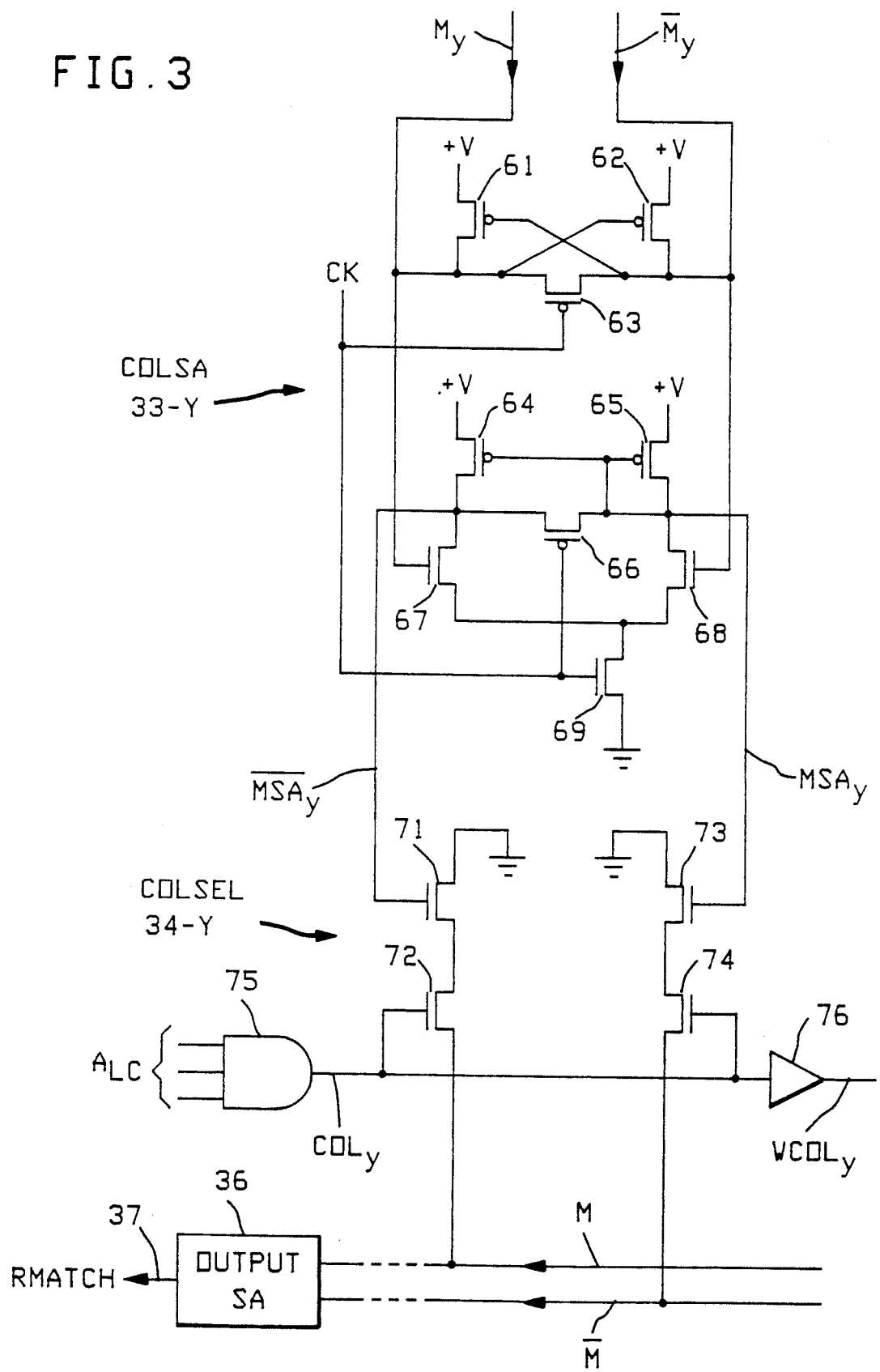
FIG. 3 shows a detailed circuit diagram of some additional components in the FIG. 1 array.

From row selector 32 in column $C_Y$, the output signals $M_Y$ and $\overline{M}_Y$ are sent to the column sense amplifier 33-Y as illustrated in FIG. 3. There, the column sense amplifier 33-Y is made of six P-channel transistors 61-66 and three N-channel transistors, all of which are interconnected as shown. Sense amplifier 33-Y operates as follows.

Initially, when the clock signal CK is low, transistor 69 turns OFF and transistors 63 and 66 turn ON. When that occurs, transistors 61 and 62 conduct until the signals $M_Y$ and $\overline{M}_Y$ are raised to the +V supply voltage minus the threshold voltage of the P-channel transistor 61 (or 62); and, transistors 64 and 65 conduct until the output signals $MSA_Y$ and $\overline{MSA}_Y$ from the sense amplifier also are raised to that same voltage.

Thereafter, when the clock signal CK goes high, transistor 69 turns ON, and transistors 63 and 66 turn OFF. Also, when the clock signal CK goes high, one of the MATCH signals $M_Y$ or $\overline{M}_Y$ will be coupled to ground as was explained above. If signal $M_Y$ goes to ground, then transistor 67 turns OFF; and, that keeps the sense amplifier output signal $\overline{MSA}_Y$ high. Conversely, if signal $\overline{M}_y$ goes to ground, then transistor 68 turns OFF; and, that keeps the sense amplifier output signal $MSA_y$ high.

From the column sense amplifier 33-Y, the signals $MSA_Y$ and $\overline{MSA}_Y$ are sent to the column selector 34-Y. Such coupling is repeated for each of the columns $C_1$ thru $C_Y$. All of the column selectors then have their outputs coupled together to the final output sense amplifier 36.

Column selector 34-Y includes four N-channel transistors 71, 72, 73 and 74, one AND gate 75, and one buffer 76. AND gate 75 decodes the column address $A_{LC}$. Thus, the gates 75 and 76 respectively generate output signals $COL_Y$ and $WCOL_Y$ which are high only when column $C_Y$ is selected. A high $COL_Y$ signal turns ON transistors 72 and 74. If the column sense amplifier output signal $\overline{MSA}_Y$ also is high, transistor 71 turns ON and the column selector output signal M is grounded. Conversely, if the column sense amplifier output signal $MSA_Y$ is high, transistor 73 turns ON and the column selector output signal $\overline{M}$ is grounded. Those signal M and $\overline{M}$ are then sent to the output sense amplifier 36, whose structure and sensing operation are the same as that of the above described column sense amplifier 33-Y. In response to the M and $\overline{M}$ signals, amplifier 36 generates the randomly selected match signal RMATCH on output conductor 37.

Figure 4:
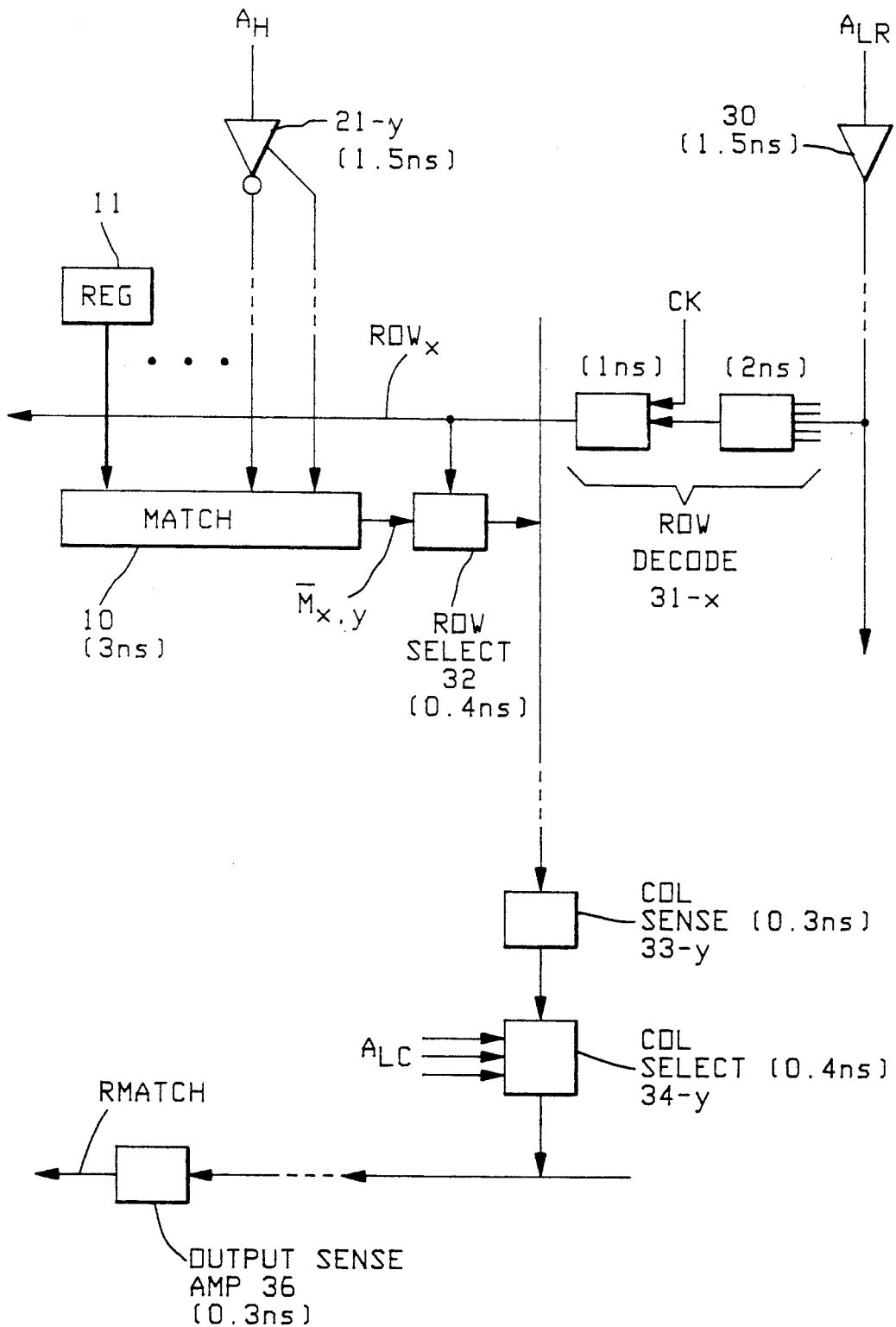
FIG. 4 provides an analysis of certain critical timing paths in the FIG. 1 array.

Considering now FIG. 4, it shows in detail the speed with which the randomly selected match signal RMATCH is generated. To begin the RMATCH signal generation, the compare address $A_H$ is sent on bus 20; and simultaneously, the row select address $A_{LR}$ and column select address $A_{LR}$ are respectively sent to the row and column selectors. In response to the compare address $A_H$, signals propagate through buffer 21-Y and comparator 10 to generate the MATCH signal $\overline{M}_{x,y}$; and in response to address $A_{LR}$, signals simultaneously propagate through buffer 30 and row decoder 31-X to generate the $ROW_x$ signal. Since the match signal $\overline{M}_{x,y}$ and the row select signal $ROW_x$ are generated in parallel, the overall speed with which the randomly selected match signal RMATCH is generated is increased.

Speed is further increased because the match signal $\overline{M}_{x,y}$ is generated in the comparator 10 by switching the voltages $V_{M+}$ and $V_{M-}$ on two conductors 45a and 45b through a voltage swing of only half the supply voltage +V. This was explained in conjunction with FIG. 2. Also, speed is increased even further since the $ROW_x$ signal from the row decoder 31-x drives only a small number of transistors relative to the total number of stages "k" in comparator 10. This was also explained in conjunction with FIG. 2.

From the comparator 10 and row decoder 31-x, signals propagate through row selector 32, columns sense amplifier 33-Y, column selector 34-Y, and output sense amplifier 36 to produce the randomly selected match signal RMATCH. Along this signal path, no multiplexors are included to select a column. Elimination of all multiplexors is possible because there is only one column per comparator circuit. If by comparison, there were one column for each stage of each match circuit, then multiplexors would have to be inserted between the columns and the sense amplifier in order to keep the total number of sense amplifiers from being too large. This multiplexor elimination further increases speed.

Figure 5:
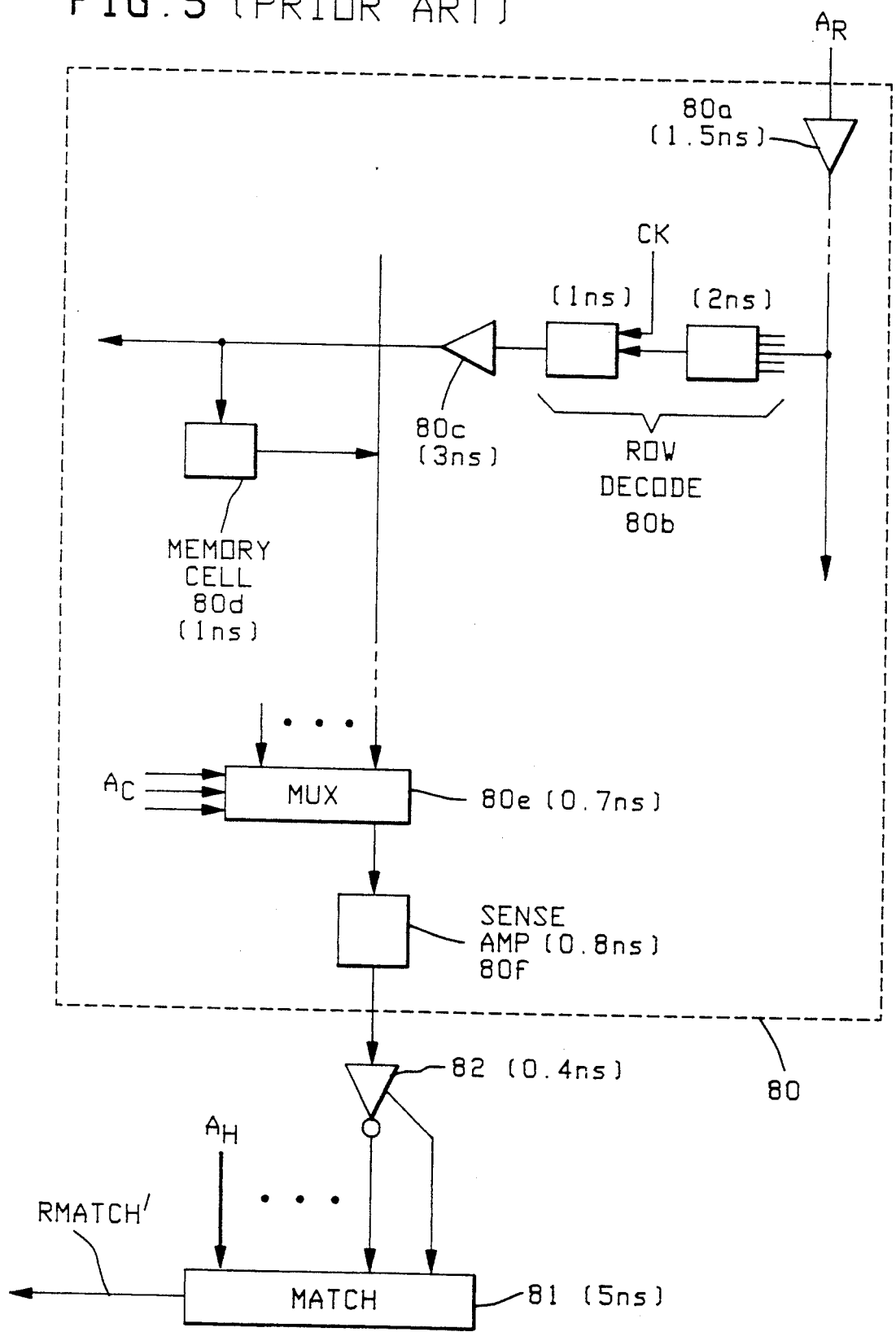
FIG. 5 provides, for comparison purposes, an analysis of a critical timing path in a prior art cache; and, FIG. 6 shows how the random access compare array of FIGS. 1–4 is used in combination with a RAM to build a high speed cache in accordance with the present invention.

For comparison purposes, FIG. 5 shows how the prior art used a RAM 80 in combination with a comparator 81 to generate a quasi random match signal RMATCH'. In the RAM 80, a set of memory cells which contains an address is randomly selected by row address $A_R$ and a column address $A_C$. Selection begins when address $A_R$ is sent to an address buffer 80a in the RAM 80. From the buffer 80a, signals propagate in a serial fashion through a row decoder 80b, a word line driver 80c, a memory cell 80d, a multiplexor 80e, and a sense amplifier 80f. This reads the address from the RAM 80 which in turn is compared by comparator 81 to the compare address $A_H$.

Generation of the RMATCH' signal via FIG. 5 occurs slower than the generating of the RMATCH signal via FIG. 4 for the following reasons. In FIG. 5, the reading of the RAM 80 and the comparing via comparator 81 occur in series; whereas in FIG. 4, the comparing in match circuit 10 and selecting via row decoder 31-X occur in parallel.

Further in FIG. 5, the number of columns in the RAM 80 is "k" times larger the an the number of columns in FIG. 4. This is because in FIG. 5 there is one column per bit, whereas in FIG. 4 there is one column per compare circuit. Due to this difference, "k" multiplexors must be included in the RAM 80 in order to keep the number of column sense amplifiers from being too large and comparable to that of FIG. 4; and these multiplexors add delay to the FIG. 5 circuit.

Also at the intersection of each column and each row in the RAM 80 of FIG. 5, a memory cell 80d is disposed; and each memory cell adds a capacitive load to the row. By comparison, in FIG. 4, there is only one row selector for every "k" stages of comparator which adds a capacitive load to the row. Consequently, to drive the extra row capacitance in the FIG. 5 RAM 80, the row line driver must be provided; and that adds delay to the FIG. 5 circuit.

Also, the prior art comparator 81 in FIG. 5 does not internally generate the signals $V_{M+}$ and $V_{M-}$ that were described in conjunction with FIG. 2 as switching in opposite directions by one-half of a logic level $+V$. Conventional comparators generate a full logic level swing on one conductor to indicate a match/mismatch; and thus they operate slower.

As a numerical example of what the above time delays are, realistic estimates of actual delays in nanoseconds (ns) using a 0.8 micron CMOS three-level metal technology are shown in FIG's. 4 & 5 for each of the illustrated components. Adding those time delays in FIG. 4 from the address signal $A_H$ to the output signal RMATCH yields a total delay of 5.9 ns; whereas adding those time delays in FIG. 5 from address $A_R$ to signal RMATCH' yields a total of 15.4 ns. In other words, the FIG. 4 circuit is over 2½ times faster than the FIG. 5 circuit!

Figure 6:
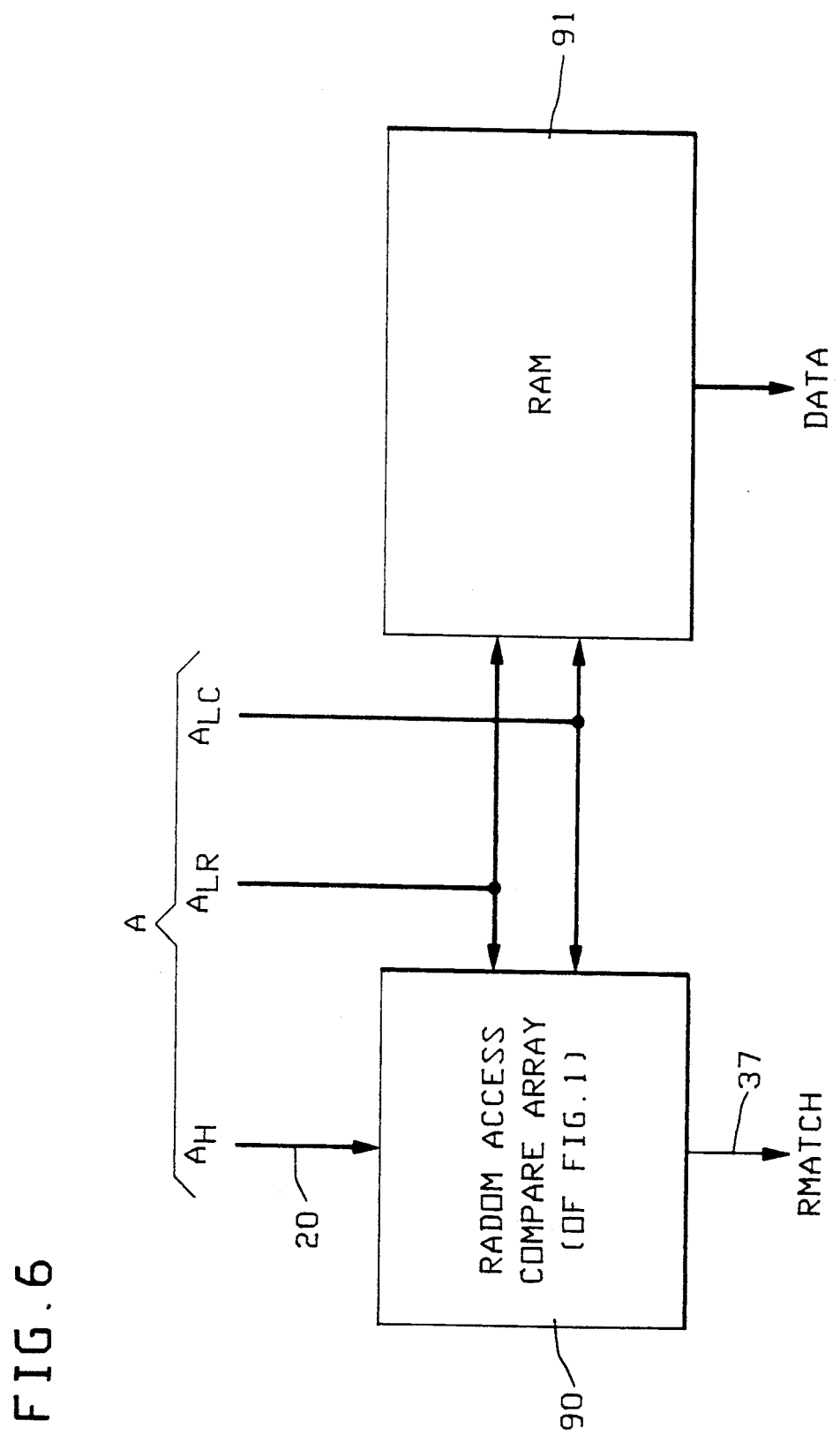

Referring now to FIG. 6, it shows how a random access compare array 90, which is constructed as described above via FIG's. 1-5, is used in combination with a RAM 91 as a data cache. In this application, the addresses $A_H$, $A_{LR}$, and $A_{LC}$ are concatenated to form an address A of a memory space. Address $A_H$ makes up the high order portion of address A, and address $A_{LR}$ together with address $A_{LC}$ make up the low order portion of address A. Depending on the size of the FIG. 6 cache, the random access compare array 90 and the RAM 91 can be on separate integrated circuit chips or on a single chip.

In operation, the random access compare array 90 and the RAM are simultaneously addressed by the low order portion of address A (i.e. - by $A_{LR}$ concatenated with $A_{LC}$). At the same time, the high order portion of address A (i.e. - $A_H$) is sent on the compare bus 20 to the random access compare array 90. Due to the speed of operation of the compare array 90, the RMATCH signal will go true (or false) before the DATA is available from the memory 91; and that provides time for a decision to be made by digital control logic (- not shown) on how to treat the DATA from RAM 91. If the RMATCH signal is true, the DATA from the RAM 91 is valid and can be used; otherwise, the DATA from the RAM 91 is invalid and needs to be updated.

An update is made by retrieving valid DATA from another memory source such as a magnetic disc (not shown); writing the valid DATA into the RAM 91 at the location that is addressed by $A_{LR}$ and $A_{LC}$; and writing the compare address $A_H$ into the register 11 of array 91 at the location that is addressed by the same $A_{LR}$ and $A_{LC}$ address. To perform the write into array 91, each of the registers 11 includes and AND gate 11a as is shown in FIG. 2. Gate 11a clocks the address $A_H$ on bus 20 into register 11 as the logical AND of signal $WROW_x$ from the row decoder, signal $WCOL_Y$ from the column decoder, clock signal CK, and as externally generated write enable signal WE.

A preferred embodiment of a random access compare array, as well as a data cache which incorporates that array, has now been described in detail. In addition, however, various changes and modifications can be made to the details of the preferred embodiment without departing from the nature and spirit of the invention. Accordingly, it is to be understood that the invention is not limited to the preferred embodiment but is defined by the appended claims.

What is claimed is:

1. A random access compare array, on an integrated circuit chip, which is comprised of:
   a plurality of multi-bit comparator circuits; each of said comparator circuits having first and second input ports, having a respective multi-bit register coupled to said first port, and having a means for generating a respective match signal when said second port receives an address that equals the bits of said register on said first port;
   an address distribution circuit which receives a compare address and sends said compare address to said second port on all of said comparator circuits; and,
   a match selection circuit which receives a select address and in response selects several of said comparator circuits in parallel with the generation of said match signals and passes a single match signal from said several comparator circuits to a single output terminal.

2. A random access compare array according to claim 1 wherein said multi-bit compare circuits and respective multi-bit registers are disposed on said chip as a matrix of rows and columns; and wherein said match selection circuit selects all of said compare circuits of one row in parallel with the generation of said match signals, and passes said single match signal from said one row of compare circuits to said single output terminal.

3. A random access compare array according to claim 2 wherein said match selection circuit selects all of said compare circuits of one row by generating a separate row decode signal for that row; and wherein each multi-bit compare circuit loads said row decode signal with an input capacitance that is substantially less then the gate capacitance of a single transistor times the total number of bits in the compare circuit.

4. A random access compare array according to claim 2 wherein said match selection circuit includes respective column sense amplifiers in each column which sense all of the match signals in said one row, a respective column selector connected to each of said column sense amplifiers, an output sense amplifier connected to all of said column selectors, and no intervening multiplexor anywhere between said selected row and said output sense amplifier.

5. A random access compare array according to claim 2 wherein each of said compare circuits includes a pair of voltage carrying conductors; and, a means for shifting the voltages on said conductors towards each other when said first and second ports receive unequal bits, and for shifting the voltages on said conductors away from each other when said first and second port receive equal bits.

6. A random access compare array according to claim 2 wherein said semiconductor chip contains a certain number of input/output terminals and said compare circuits in said array outnumber said input/output terminals.

7. A random access compare array according to claim 2 in combination with a random access memory; said random access memory having a plurality of data words stored therein, and having a read address port which is coupled to receive said select address in parallel with said array such that said memory reads a stored data word in response to said select address while—in parallel therewith—said array selects one of said match signals.

8. A random access compare array in combination with a random access memory according to claim 7 wherein said match selection circuit selects all of said compare circuits of one row by generating a separate row decode signal for that row; and wherein, each multi-bit circuit loads said row decode signal with an input capacitance that is substantially less then the gate capacitance of a single transistor times the total number of bits in the compare circuit.

9. A random access compare array in combination with a random access memory according to claim 8 wherein said match selection circuit includes respective column sense amplifiers in each column which sense all of the match signals in said one row, a respective column selector connected to each of said column sense amplifiers, an output sense amplifier connected to all of said column selectors, and no intervening multiplexor anywhere between said selected row and said output sense amplifier.

10. A random access compare array in combination with a random access memory according to claim 9 wherein each of said compare circuits includes a pair of voltage carrying conductors, and a means for shifting the voltages on said conductors towards each other when said first and second ports receive unequal bits and for shifting the voltages on said conductors away from each other when said first and second ports receive equal bits.

11. A random access compare array in combination with a random access memory according to claim 10 wherein said semiconductor chip contains a certain number of input/output terminals and said compare circuits in said array outnumber said input/output terminals.

* * * * *